(12) United States Patent
Seniuk et al.

(10) Patent No.: US 6,528,238 B1
(45) Date of Patent: Mar. 4, 2003

(54) METHODS FOR MAKING PATTERNS IN RADIATION SENSITIVE POLYMERS

(76) Inventors: David Seniuk, 237 Jean-Lesage, Aylmer, Quebec (CA), J9J 2S3; Paul J. Paddon, 109-465 Richmond Road, Ottawa, Ontario (CA), K2A 1Z1; David M. Adams, 1783 Cloverlawn Cr, Gloucester, Ontario (CA), K1J 6V6

( * ) Notice: Subject to any disclaimer, the term of this patent is extended or adjusted under 35 U.S.C. 154(b) by 22 days.

(21) Appl. No.: 09/667,622

(22) Filed: Sep. 22, 2000

(51) Int. Cl.[7] .............................. G03F 7/00; G03F 7/20; G03F 7/22
(52) U.S. Cl. .................. 430/312; 430/322; 430/330; 430/394; 430/396; 430/397
(58) Field of Search ................................. 430/312, 322, 430/330, 394, 396, 397

(56) References Cited

U.S. PATENT DOCUMENTS

| | | | |
|---|---|---|---|
| 4,947,413 A | 8/1990 | Jewell et al. | ............... 378/84 |
| 5,407,785 A * | 4/1995 | Leroux | ................. 430/312 |
| 5,593,813 A * | 1/1997 | Kim | ................. 430/312 |
| 5,652,084 A * | 7/1997 | Cleeves | ................. 430/313 |
| 5,667,940 A * | 9/1997 | Hsue et al. | ................. 430/312 |
| 5,811,222 A * | 9/1998 | Gardner et al. | ................. 430/312 |
| 5,972,568 A | 10/1999 | Seniuk et al. | ................. 430/312 |
| 6,007,968 A | 12/1999 | Furukawa et al. | ................. 430/314 |
| 6,043,496 A | 3/2000 | Tennant et al. | ................. 250/492.1 |
| 6,187,486 B1 * | 2/2001 | Lai et al. | ................. 430/394 |

* cited by examiner

*Primary Examiner*—Mark F. Huff
*Assistant Examiner*—Kripa Sagar

(57) ABSTRACT

Groove patterns on substrates coated with photoresist are made using the technique of photolithography by exposing photoresist via a reticle. In the instant invention, the pattern is provided on the reticle with a period larger than the final period to be printed on the photoresist. The complete pattern is obtained by subjecting the photoresist to two or more exposures and aligning the substrate relative to the reticle between exposures. In a further embodiment the slits on the reticle defining the line width of the grooves are larger than required and photoresist is subjected to multiple partial exposure. Both embodiments significantly reduce diffraction caused by the reticle and improve the resolution of the technique.

8 Claims, 5 Drawing Sheets

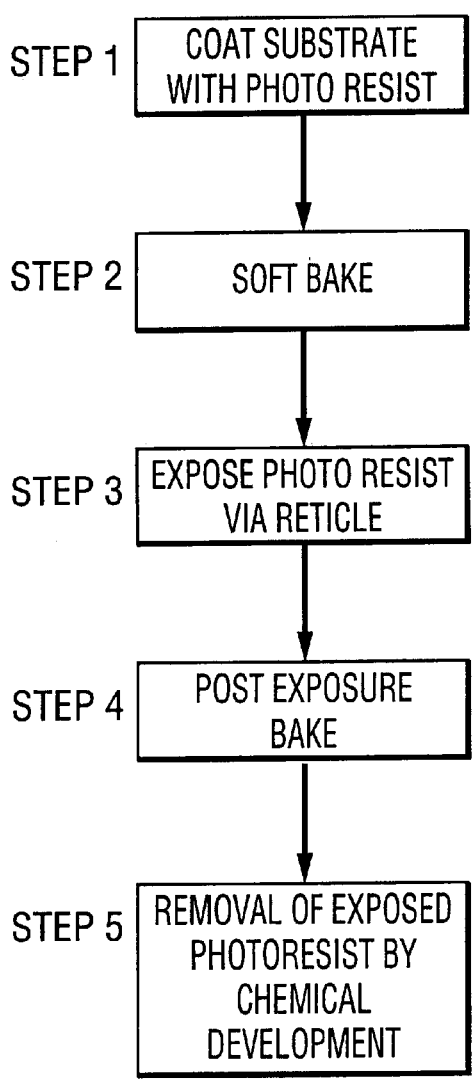
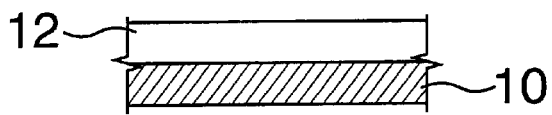
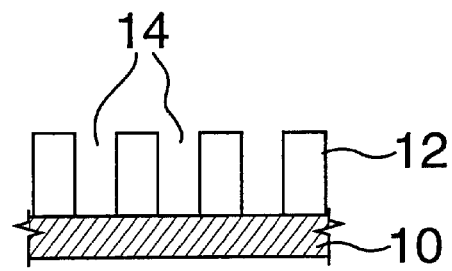
FIG. 1
PRIOR ART

METHODS FOR MAKING PATTERNS IN RADIATION SENSITIVE POLYMERS

The present invention relates to methods of making patterns in photoresist using photolithography. More particularly, this invention is directed at making groove patterns in photoresist having line width in the submicron range.

BACKGROUND OF THE INVENTION

The formation of highly precise and specific groove patterns of small dimensions (micrometer or less) in material is widely used in diverse technologies such as optical gratings, semi-conductor chips, surface wave devices etc. Mass production of such printed patterns on substrates can be achieved by photolithography. In this technique, photosensitive material (photoresist) is exposed, via a reticle or "mask" exhibiting the desired pattern, to electromagnetic radiation followed by chemical development to remove the photoresist.

The established photolithographic equipment to print patterns with sub-micron line width is the so-called stepper. Typically a so-called 5× stepper in which the pattern on the reticle is produced at five times the size of the final pattern can be used to provide high resolution. The image of the pattern is then projected through lenses to produce the pattern on the photoresist at the appropriate scale.

Most devices that require grooves with small line widths also exhibit high line density with spacing between the grooves approaching that of the electromagnetic radiation source's wavelength. As a result, the radiant energy cannot pass through a slit that is smaller than the wavelength. Consequently, it has not been practical to mass produce devices with line widths of about 0.25 $\mu$m or less using a 5× stepper.

The diffraction problem can also be addressed by providing special filters to intercept the diffraction before it reaches the photoresist surface (see for example U.S. Pat. No. 4,947,413). However, adjustment of filters may be difficult and time consuming.

The diffraction problem has been partly overcome for the making of surface wave devices as described in U.S. Pat. No. 5,972,568 wherein a method is provided that increases the spacing between slits on the reticle by separating the pattern in two or more subsets. The final pattern is then obtained by exposing the photoresist to each subset. However, the method of the '568 patent is restricted to surface wave devices because their very specific surface patterns, which include connection rails, prevent the application of the method to other devices exhibiting different patterns.

The resolution of the photolithography technique is also limited by the width of the slits forming the pattern on the reticle. The width of the slits necessary to achieve the desired pattern is, in turn, limited by the wavelength of the electromagnetic radiation used. For instance, most photolithographic apparatus for producing sub-micron patterns use deep ultraviolet (DUV) radiation. The wavelength of this radiation is the range of 180–250 nm and enables the use of narrow slits. However, as the wavelength of the source approaches the width of the slits, the radiation cannot penetrate the slit.

In general, the printing of small linewidth patterns (less than 0.25 $\mu$m) is achieved by using direct writing with electron beams. However, this method is very slow and, consequently, expensive.

It is thus desirable to develop a technique that would further reduce the diffraction caused by the high line density and narrow slits of the reticle.

SUMMARY OF THE INVENTION

According to one aspect of the present invention, there is provided a method of making parallel grooves in a photoresist coating on a substrate. The method comprises the steps of: a) providing a reticle with a pattern of parallel lines each line being opaque to electromagnetic radiation, the distance between the adjacent two lines being greater than the width of the line; b) subjecting said photoresist to a first exposure of electromagnetic radiation of a selected wavelength via said reticle with a dose less than is required to fully sensitize said photoresist, wherein, by means of the width of said line and the distance between the adjacent two lines, an alternate pattern of an unexposed area and a partially exposed area is formed on the photoresisit coating; c) shifting said reticle relative to said photoresist coating or vice versa such that each line of said reticle is projected in each said partially exposed area; d) subjecting said photoresist to a second exposure of electromagnetic radiation of a selected wavelength via said shifted reticle with a dose less than is required to fully sensitize said photoresist to development such that the total dose of the two exposures is equal to or greater than the dose required to fully sensitize the photoresist, wherein that area of each said partially exposed area that is not projected by the line of said shifted reticle is fully exposed; and e) developing the photoresist, wherein said fully exposed area is removed from the photoresist whereby a parallel grooves can be formed in a photoresist coating.

BRIEF DESCRIPTION OF THE DRAWINGS

These and other features of the invention will become more apparent from the following description in which reference is made to the appended drawings wherein:

FIG. 1 is a flow chart diagram of the steps of a known method of making a pattern on photoresist.

DESCRIPTION OF PREFERRED EMBODIMENT

Referring to FIG. 1, the known method of making submicron patterns in photoresist comprises a sequence of steps 1 to 5 which are described as follows:

In the step 1, a substrate 10 of a selected material is coated with photoresist 12, which is a polymer sensitive to electromagnetic radiation of a given wavelength. In step 2, the substrate together with the photoresist coating is subjected to "soft baking" during which traces of residual solvents used in the coating step are removed by evaporation under elevated temperatures. In the step 3, the photoresist layer 12 is selectively exposed to electromagnetic radiation via a reticle in a stepper, for example a 5x stepper as described above. The reticle may comprise a glass plate having a layer of material opaque to the radiation. The desired pattern on the reticle is processed by removing specific areas of the opaque material. The nature of the opaque material will vary depending on the wavelength of the electromagnetic radiation used. For example, chrome may be used for radiation spanning the visible part of the spectrum. Patterns of electromagnetic radiation can also be generated using other means such as phase contrast masks alone or in combination with opaque materials such as chrome.

The exposed photoresist is then optionally subjected to a post exposure baking step at high temperatures (step 4). Without wishing to be limited by any theory, the post exposure baking step reduces standing wave reflection patterns in patterns such as laser gratings.

The baking conditions for steps 2 and 4 may vary depending on the nature of the photoresist and solvent used. For example, the soft baking may be carried at 95° C. for 60 seconds and the post-exposure baking may be carried at 120° C. for 60 seconds. However, other temperatures and times of baking are also considered to be within the scope of the invention.

The final step is to remove the exposed photoresist by chemical development (step 5), resulting in a pattern being printed on the photoresist layer with grooves 14 in the photoresist layer 12. It will be appreciated that the steps of this general outline may vary according to the type of device being prepared and the nature of the photoresist used will be apparent to those skilled in the art.

Figure 2:
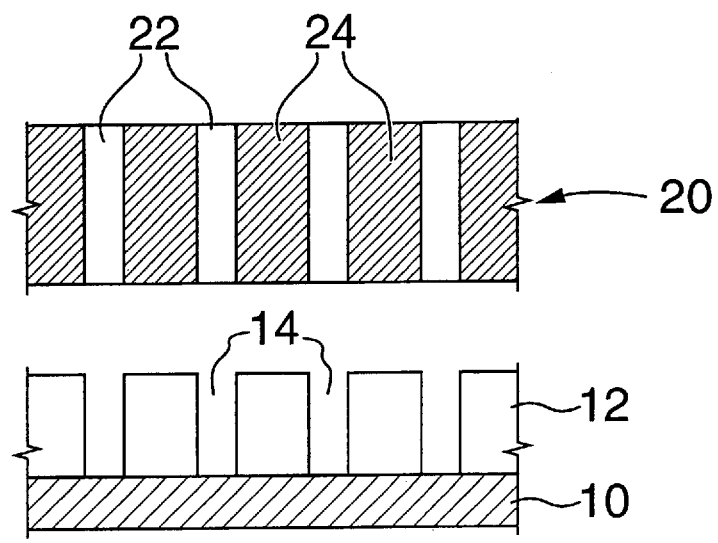
FIG. 2 is a schematic representation, not to scale and for the purpose of example only, of patterns on reticles used in steppers for photolithography.

Reticles in photolithography are usually prepared by providing the complete pattern to be printed on an area of the photoresist so that the printing is done in a single exposure. FIG. 2 depicts a hypothetical pattern on a reticle generally described by 20 having slits 22 (areas transparent to radiation) and areas opaque to radiation 24. There are two types of photoresist: positive and negative. With positive photoresists, the pattern to be printed on the photoresist layer is defined by the slits 22 which allow the passage of electromagnetic radiation. The radiation will sensitize the exposed areas of the photoresist to a chemical developer which, when applied will remove the photoresist areas exposed. Negative photoresist is already sensitive to the chemical developer. Exposure of the photoresist to radiation desensitize it to the action of the developer. Thus the pattern on the photoresist layer for negative photoresist is defined by the opaque areas 24. While the invention will be exemplified with reference to positive exposure, it will be appreciated that negative exposure can also be used.

Current photolithography technology using deep ultraviolet (DUV) sources allows printing of patterns having line widths of approximately 0.15 μm or more. However, the line width is limited by the diffraction of radiation when the width of the slits approaches that of the radiation's wavelength. Furthermore, when the opaque areas between slits approach the wavelength of the electromagnetic radiation, the image is degraded by diffraction. Both types of diffraction contribute to reduce the resolution of the technique.

Figure 3:
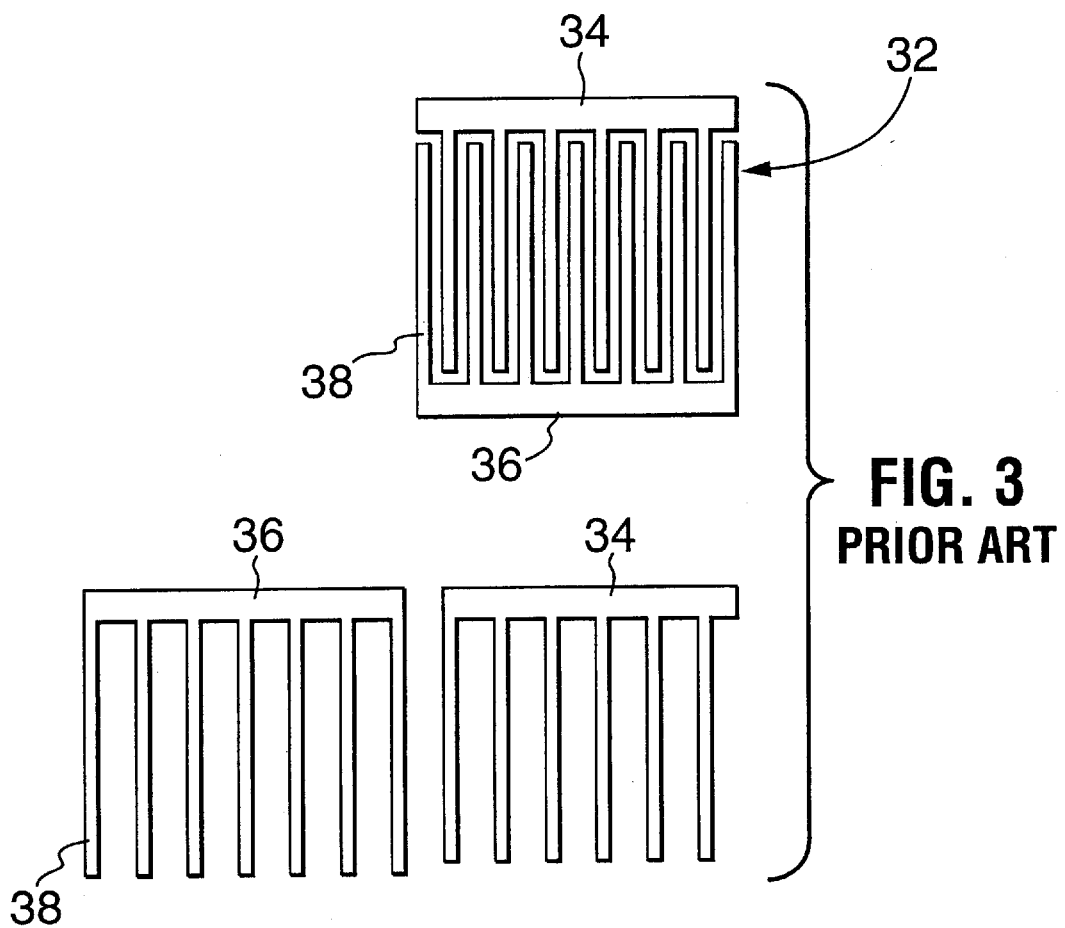
FIG. 3 is a schematic diagram of conductors of a surface wave device.

The "diffraction" problem has been partly solved for surface wave devices in U.S. Pat. No. 5,972,568. The characteristic interdigital finger pattern 32 required for these devices is schematically represented in FIG. 3. It consists of connection rails 34 and 36 and attached fingers 38. The connection rails and the fingers are transparent to electromagnetic radiation. The method described in this patent specifies that the pattern is divided in two to increase the spacing between adjacent fingers 38 thus reducing the diffraction arising from the dense pattern on the reticle. The whole pattern can then be obtained by subjecting the photoresist layer to two exposures, each using one half of the pattern.

However, this method suffers from the limitation that because the arrangement of the fingers on the two connection rails is not necessarily identical, at least two patterns must be created on the reticle as shown in FIG. 3. The printing of the complete pattern thus requires substantial alignment of the substrate relative to the reticle between exposures contributing to alignment errors.

Figure 4:
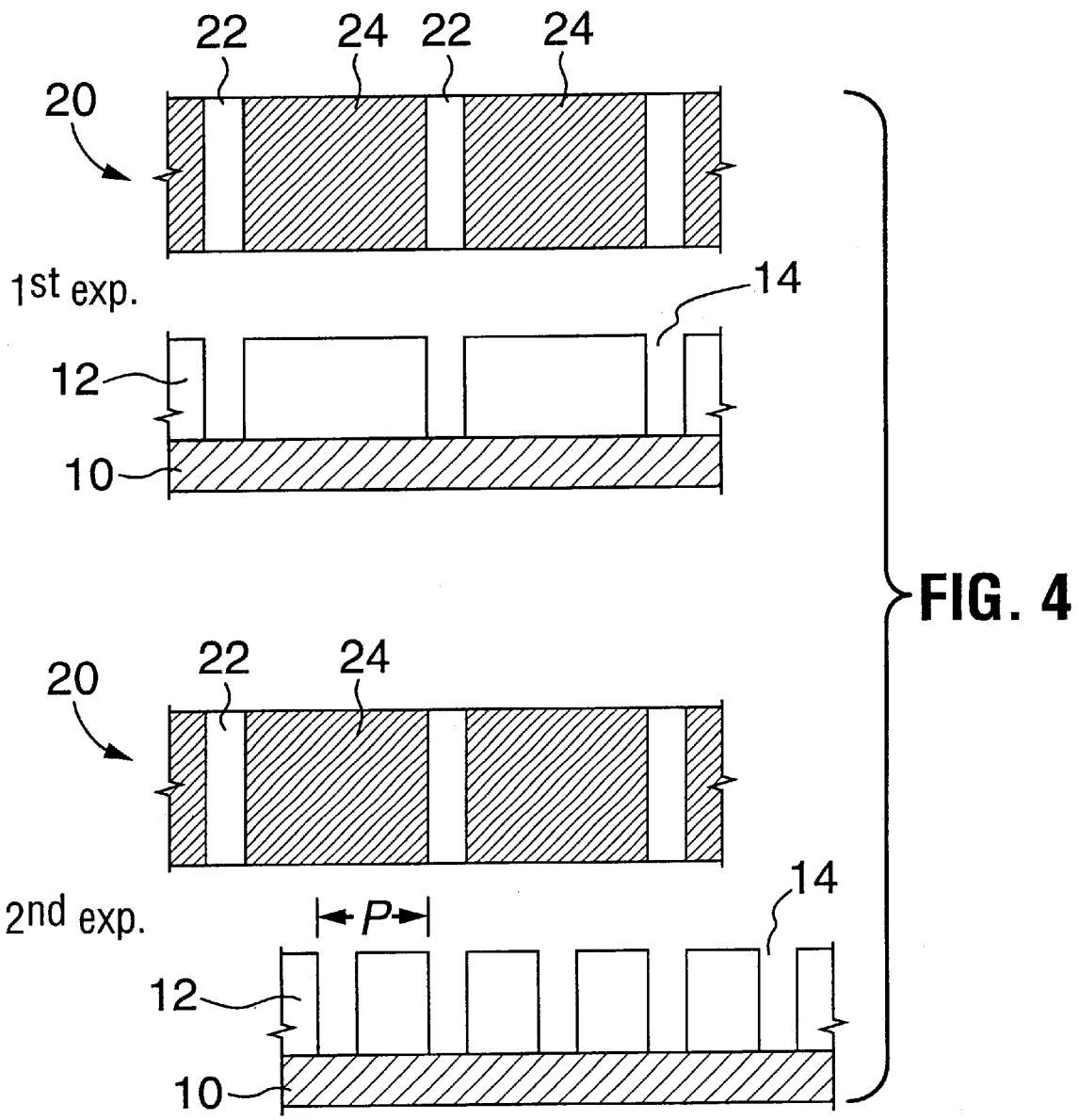
FIG. 4 is a schematic diagram illustrating the method of multiple exposures for the making of grooves in photoresists.

This limitation is substantially overcome in the present method. Referring to FIG. 4, a reticle is provided with a single pattern exhibiting spacing between slits larger than the final spacing on the photoresist. The complete pattern may then be obtained by subjecting the photoresist to at least two exposures via the same pattern and displacing the substrate relative to the reticle between exposures. This technique, which requires only one pattern on the reticle, reduces the number of alignment steps required to print a similar pattern using the method of U.S. Pat. 5,972,568. Deviations from the ideal positioning of the lines are thus reduced. Furthermore the time required to produce the reticle is also reduced.

In one embodiment of the instant invention, a desired pattern on the photoresist defined by a first order period P, defined as the distance between similar points in the pattern, is obtained by providing a spacing between slits on the reticle equal to a selected multiple of the width of the grooves to be printed on the photoresist. In a further embodiment, the spacing between the slits is three times that of the width of the grooves to be printed on the photoresist. The pattern on the photoresist can then be obtained by subjecting the photoresist to a first exposure, moving the substrate by one period and subjecting the photoresist to a second exposure using the same pattern on the reticle. The diffraction can be further reduced by increasing the space between slits even more, and subjecting the photoresist to the appropriate number of exposures to obtain the desired pattern, the substrate being displaced by the required predetermined amount between each exposure.

As will be apparent to those skilled in the art, the present method is not limited to the making of patterns exhibiting a first order period (unique period) but provides the advantage of enabling the making of second or higher order periods simply by displacing the substrate between each exposure by the amount necessary to produce the desired periods. This feature of the present method is particularly useful for the making of devices such as laser gratings that often require more than one period. Furthermore, it will be appreciated that the method herein is not limited to patterns exhibiting rectilinear line shapes.

Figure 5:
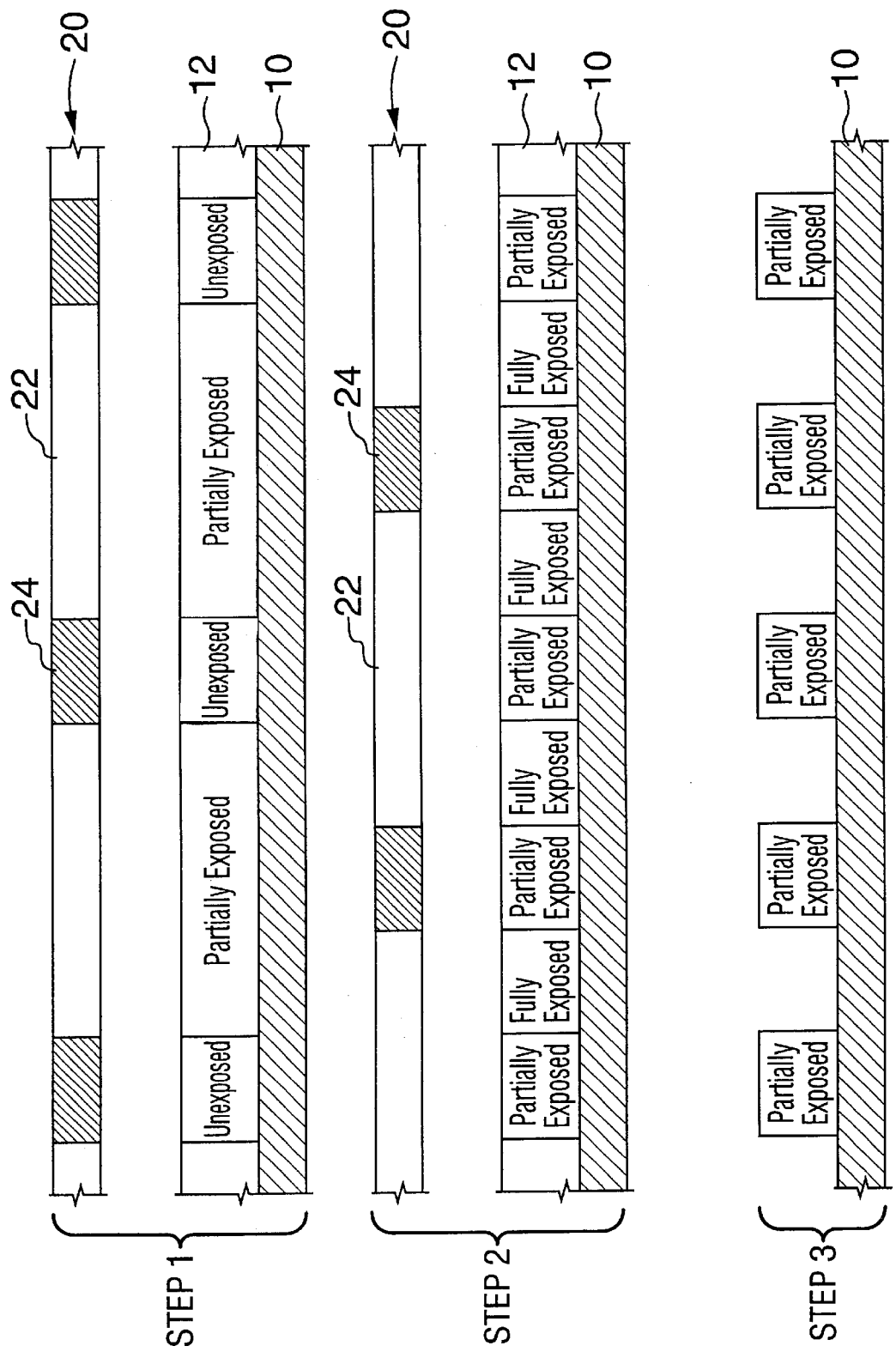
FIG. 5 is a schematic diagram illustrating the method of partial exposures for the making of grooves in photoresists.

In a further embodiment of the instant invention the diffraction at each slit is overcome by providing a reticle having a pattern designed so that the width of the slits is larger than the desired line width to be printed on the photoresist and large enough to significantly reduce diffraction. The width of the slits can be a selected multiple of the width of the grooves to be printed on the photoresist. The reticle may also be designed to have both larger spacing between the slits and larger slits. Referring to FIG. 5, this embodiment is now further described.

For the purpose of this disclosure, "fully exposed" means that the photoresist has received a dose of electromagnetic radiation sufficient to fully sensitize it to the action of a chemical developer resulting in the substantially complete removal of the photoresist in the exposed areas under given developing conditions.

In step 1 of FIG. 5, the photoresist layer 12 is partly exposed by subjecting it to a first exposure, via a reticle 20 having slits 22 larger than the desired linewidth, with a total dose of electromagnetic radiation that is less than the dose required to fully sensitize the photoresist to developer. After this partial exposure the substrate is displaced and a second exposure is performed again using a dose lower than is required for full sensitization with the proviso that the total dose of the first and second exposure is equal to or greater than the dose required for the full sensitization of the photoresist. As a result, regions of the photoresist will be partly exposed, thus substantially not sensitized and others, defining the pattern, will be fully exposed. Upon development of the photoresist only the regions that have been fully exposed will be removed by the action of the developer. This embodiment of the invention also encompasses the possibility of providing more than two exposures provided that the areas of the photoresist corresponding to grooves receive a dose sufficient to fully sensitize the photoresist while other areas receive less than the threshold dose.

The delivery of the appropriate dose of electromagnetic radiation can be achieved by several means as would be obvious to one skilled in the art. Examples include but are not limited to; controlling the output power of the radiation source, controlling the time of exposure, and using intensity filters. It will also be understood that the dose necessary to sensitize the photoresist will depend on the nature of the material of the photoresist.

Figure 6:
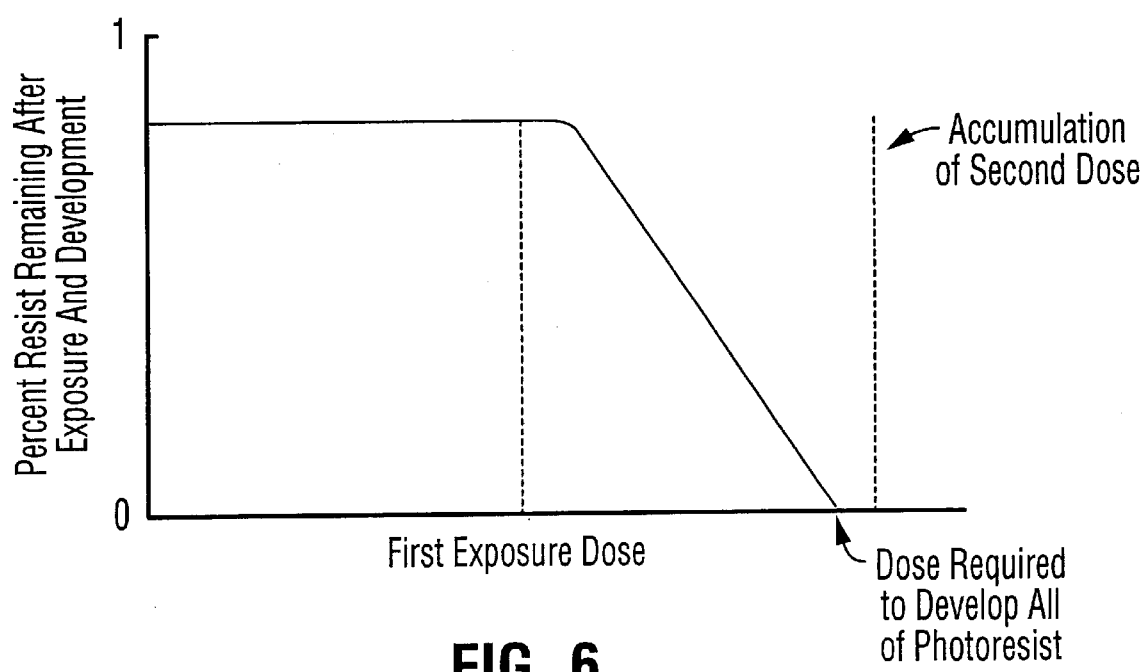
FIG. 6 is a graphic of the general relationship, given only for explanatory purposes, between the removal of photoresist and the radiation dose.

Without wishing to be bound by any theory, the photoresist sensitivity-dose response for positive or negative photoresist is usually not a linear function but rather exhibits a threshold at which a small variation in the dose results in an large variation in the sensitization of the photoresist. The general shape of the curves describing the sensitization of positive or negative photoresists to electromagnetic radiation of a given wavelength is illustrated by FIG. 6. As would be obvious to one skilled in the art, the shape of the curve may depend on several physico-chemical factors, among which the nature of the photoresist. The determination of the appropriate dose for each exposure must be determined taking into account the characteristic of the dose-response curve.

For example, the dose of the first partial exposure for a photoresist can be between 25 and 75% of the dose required for full sensitization and the dose of the second partial exposure between 25 and 75% with the proviso that the total dose is at least 100% of the dose required for full sensitization. In a preferred embodiment, the first partial dose is between 40 and 60% and the second partial dose between 40 and 60%. With the proviso that the total dose is at least 100% of the dose required for full sensitization.

The production of grooves in photoresist having line width in the submicron range is currently achieved by using wavelength in the UV or DUV region of the electromagnetic spectrum to reduce as much as possible the diffraction arising at the slits. Thus, the use of longer wavelengths is prohibited by the small width of the slits to achieve submicron line width. In the partial exposure embodiment of the instant invention, this limitation is overcome by making the slits larger than the required line width. The instant invention thus allows the use of electromagnetic radiation of longer wavelength to print comparatively shorter line width. This may allow the use of photoresist material not sensitive DUV radiation but sensitive to longer wavelength, such as the UV region, for making devices with patterns exhibiting linewidth in the submicron range. Furthermore, cheaper radiation sources and optic systems can be used.

Referring to FIG. 1, the activation of photoresist requires a soft-baking step prior to exposure to electromagnetic radiation. This step is necessary to desensitize the photoresist to radiation and to remove solvents used during the coating of the substrate with the photoresist. Soft baking at a lower temperature may result in the photoresist being more soluble in the developer even without any exposure to light. However, soft-baking at higher temperatures may result in the desensitization of the photoresist to electromagnetic radiation. One possible limitation of the instant technique is its sensitivity to soft-baking temperature. Small changes in the soft baking temperatures may affect the response of the curve describing the sensitivity of the photoresist to electromagnetic radiation.

In a further embodiment of the instant invention, a device comprising a photoresist produced by the above described methods is considered to be within the scope of the invention.

The present invention has been described with regard to preferred embodiments. However, it will be obvious to persons skilled in the art that a number of variations and modifications can be made without departing from the scope of the invention as described herein.

What is claimed is:

1. A method of making parallel grooves in a photoresist coating on a substrate comprising the steps of:
   a) providing a reticle with a pattern of parallel lines each line being opaque to electromagnetic radiation, the distance between adjacent two lines being greater than the width of the line;
   b) subjecting said photoresist to a first exposure of electromagnetic radiation of a selected wavelength via said reticle with a dose less than is required to fully sensitize said photoresist, wherein, by means of the width of said line and the distance between the adjacent two lines, an alternate pattern of an unexposed area and a partially exposed area is formed on the photoresisit coating;
   c) shifting said reticle relative to said photoresist coating or vice versa such that each line of said reticle is projected in each said partially exposed area;
   d) subjecting said photoresist to a second exposure of electromagnetic radiation of a selected wavelength via said shifted reticle with a dose less than is required to fully sensitize said photoresist to development such that the total dose of the two exposures is equal to or greater than the dose required to fully sensitize the photoresist, wherein part of each said partially exposed area is fully exposed; and
   e) developing the photoresist, wherein said fully exposed area is removed from the photoresist whereby parallel grooves can be formed in a photoresist coating.

2. The method of claim 1 wherein said distance between the adjacent two lines is a selected multiple of the width of the line.

3. The method of claim 2 wherein said selected multiple is equal to 3, whereby equally-spaced grooves can be obtained.

4. The method of claim 1 wherein the photoresist is a polymer sensitive to electromagnetic radiation.

5. The method of claim 1 wherein the distance between said adjacent two lines is greater than said selected wavelength and the width of said line is selected such that the width of said formed groove is less than said selected wavelength.

6. The method of claim 5 wherein said selected wavelength corresponds to the ultraviolet (UV) region of the electromagnetic spectrum.

7. The method of claim 6 wherein said selected wavelength corresponds to the deep ultraviolet (DUV) region of the electromagnetic spectrum.

8. The method of claim 1 wherein each of said first and second exposures is between 25 and 75% of the dose required to fully sensitize the photoresist coating with the proviso that the total dose is 100% or greater.

* * * * *